(12) United States Patent
Bopp et al.

(10) Patent No.: US 7,332,892 B2
(45) Date of Patent: Feb. 19, 2008

(54) METHOD FOR PREDICTING THE VOLTAGE OF A BATTERY

(75) Inventors: Richard Bopp, Stuttgart (DE); Armin Klöpfer, Backnang (DE)

(73) Assignee: Daimler AG, Stuttgart (DE)

( * ) Notice: Subject to any disclaimer, the term of this patent is extended or adjusted under 35 U.S.C. 154(b) by 279 days.

(21) Appl. No.: 10/537,806

(22) PCT Filed: Oct. 16, 2003

(86) PCT No.: PCT/EP03/11484

§ 371 (c)(1),
(2), (4) Date: Jul. 20, 2005

(87) PCT Pub. No.: WO2004/053509

PCT Pub. Date: Jun. 24, 2004

(65) Prior Publication Data

US 2006/0055373 A1    Mar. 16, 2006

(30) Foreign Application Priority Data

Dec. 9, 2002  (DE) ............................... 102 57 588

(51) Int. Cl.
*H02J 7/00* (2006.01)
(52) U.S. Cl. ..................... 320/132; 320/131
(58) Field of Classification Search ............... 320/133, 320/137, 139, 145, 162, 163; 702/63
See application file for complete search history.

(56) References Cited

U.S. PATENT DOCUMENTS

| | | | | |
|---|---|---|---|---|
| 4,937,528 A | * | 6/1990 | Palanisamy | ................. 324/430 |
| 5,617,324 A | * | 4/1997 | Arai | ............................ 702/63 |
| 5,635,820 A | * | 6/1997 | Park | ........................... 320/148 |
| 5,684,387 A | * | 11/1997 | Patino | ........................ 320/106 |
| 5,798,934 A | * | 8/1998 | Saigo et al. | .................. 702/63 |
| 5,864,237 A | * | 1/1999 | Kawai et al. | ............... 324/430 |
| 6,064,182 A | | 5/2000 | Eguchi | |
| 6,215,312 B1 | * | 4/2001 | Hoenig et al. | .............. 324/427 |
| 6,232,747 B1 | * | 5/2001 | Takahashi et al. | .......... 324/427 |

(Continued)

FOREIGN PATENT DOCUMENTS

DE    39 36 638 C1    3/1991

(Continued)

*Primary Examiner*—Bao Q. Vu
*Assistant Examiner*—Nguyen Tran
(74) *Attorney, Agent, or Firm*—Fitch Even Tabin & Flannery; Norman N. Kunitz (57) ABSTRACT

The present invention discloses a method for predicting the voltage of a battery, in particular a vehicle battery. The method according to the invention makes it possible to predict a voltage drop before it actually occurs as a result of a load. For this purpose, a filtered battery voltage and a filtered battery current are first of all determined from battery data, such as the battery voltage, the battery current, the battery temperature and the dynamic internal resistance. The resistive voltage drop across the dynamic internal resistance is determined from the difference current between the filtered battery current and the predetermined load current. Furthermore, a polarization voltage is calculated as a function of the filtered battery current, and is then filtered. The predicted battery voltage is calculated from the filtered battery voltage, minus the resistive voltage drop and the filtered polarization voltage. A decision on further measures can be made on the basis of this predicted battery voltage.

10 Claims, 4 Drawing Sheets

U.S. PATENT DOCUMENTS

| | | |
|---|---|---|
| 6,515,454 B2 * | 2/2003 | Schoch ................. 320/132 |
| 6,718,214 B1 | 4/2004 | Schoettle et al. |
| 2001/0035739 A1 * | 11/2001 | Laig-Horstebrock et al. ............... 320/132 |
| 2001/0040443 A1 * | 11/2001 | Suzuki et al. ........... 320/134 |
| 2002/0008495 A1 * | 1/2002 | Dougherty et al. ...... 320/104 |
| 2002/0070706 A1 * | 6/2002 | Champlin ............... 320/132 |
| 2002/0093312 A1 * | 7/2002 | Choo .................... 320/149 |
| 2002/0101243 A1 * | 8/2002 | Mentgen et al. ......... 324/427 |
| 2002/0130637 A1 * | 9/2002 | Schoch ................. 320/132 |
| 2003/0030414 A1 * | 2/2003 | Suzuki ................. 320/136 |
| 2003/0071599 A1 * | 4/2003 | Yoo .................... 320/132 |

FOREIGN PATENT DOCUMENTS

| | | |
|---|---|---|
| DE | 692 27 938 T2 | 7/1999 |
| DE | 199 60 079 A1 | 6/2000 |
| DE | 102 07 659 A1 | 9/2002 |
| EP | 0 505 333 B1 | 12/1998 |
| GB | 2 121 971 A | 1/1984 |
| GB | 2 148 518 A | 5/1985 |

* cited by examiner

METHOD FOR PREDICTING THE VOLTAGE OF A BATTERY

CROSS REFERENCE TO RELATED APPLICATION

This application is the National Stage filing under 35 U.S.C. 371 of International Application No. PCT/EP2003/011484, filed Oct. 16, 2003, and claims priority of German Patent Application 102 57 588.6, filed Dec. 9, 2002, which is incorporated herein, in its entirety, by reference.

BACKGROUND OF THE INVENTION

The invention relates to a method for predicting the voltage of a battery, in particular of a vehicle battery.

One problem that traditionally occurs is that, for example in a motor vehicle power supply system, the voltage collapses in certain load conditions when the battery is poor or discharged to such an extent that important systems, such as the braking system, no longer operate fully and, in some circumstances, the driver can then operate the vehicle only with major restrictions.

DE 39 36 638 G1 discloses a method in which the loads on a vehicle power supply system are switched off or reduced when the vehicle battery state of charge falls below a specific level, in order to prevent excessive discharging of the battery. Which load or loads is or are switched off depends on the group of loads to which it or they belong. By way of example, one such group is composed of "conditionally switchable loads" (BSV) and/or "switchable loads" (SV). The group is in this case always completely switched off, or its consumption is reduced. Each group has a priority relating to vehicle safety and/or its importance. The process of switching off or reducing the individual groups starts with the group with the lowest priority. If this does not lead to an improvement in the state of charge of the battery, further groups are switched off or reduced successively until the battery state of charge reaches a specific level.

Furthermore, DE 199 60 079 A1 discloses a method for switching various classes of loads on and off by means of switching elements within an energy management process, which is carried out by a controller. The switching elements are in this case actuated such that the selected priorities for actuation of the switching elements can be changed dynamically during operation. The switching priorities can thus be adapted as a function of the operating state during operation. Loads are switched off by varying the switching priority such that the perceptibility of the operating states is as far as possible suppressed.

When using this conventional method, a load or a group of loads is switched off or reduced only once a poor state of charge has already been found. In order to prevent a safety-relevant system, such as the braking system, no longer being fully operationally available as a result of being reduced, a computation-intensive method is in this case currently used to calculate the state of charge of the battery, and this considerably increases the costs of the associated controller.

One object of the present invention is thus to provide a simple and cost-effective method for predicting the voltage of a battery, by means of which a state in which the battery is poor or discharged and in which a voltage drop can occur in certain load conditions can be predicted, and which has appropriate countermeasures to be initiated before this state occurs, in order that specific safety-relevant loads remain fully operational.

SUMMARY OF THE INVENTION

According to the invention, this object is achieved by a method for predicting the voltage of a battery having the features as claimed in claim 1. Further advantageous developments of the invention are specified in the dependent claims.

The method according to the invention for predicting the voltage of a battery now allows critical battery states to be identified in good time, particularly critical power supply system states in the vehicle, and allows countermeasures to be initiated, such as load shedding or increasing the engine rotation speed.

These and further objects, features and advantages of the present invention will become clear from the following description of one preferred exemplary embodiment, in conjunction with the drawing, in which:

DETAILED DESCRIPTION OF THE INVENTION

Figure 1:
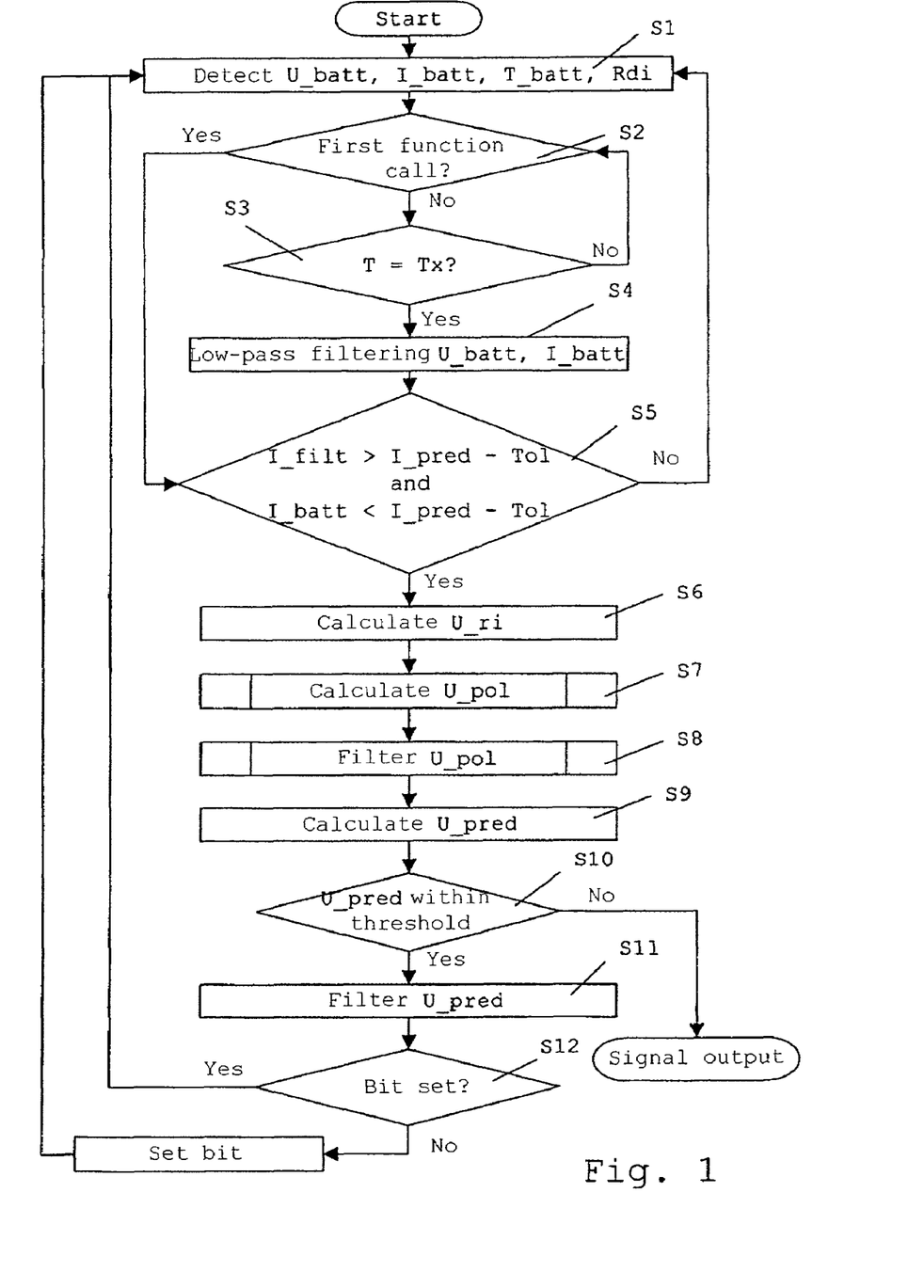
FIG. 1 shows a flowchart of a method according to the invention for predicting a voltage of a battery U_pred
Figure 2:
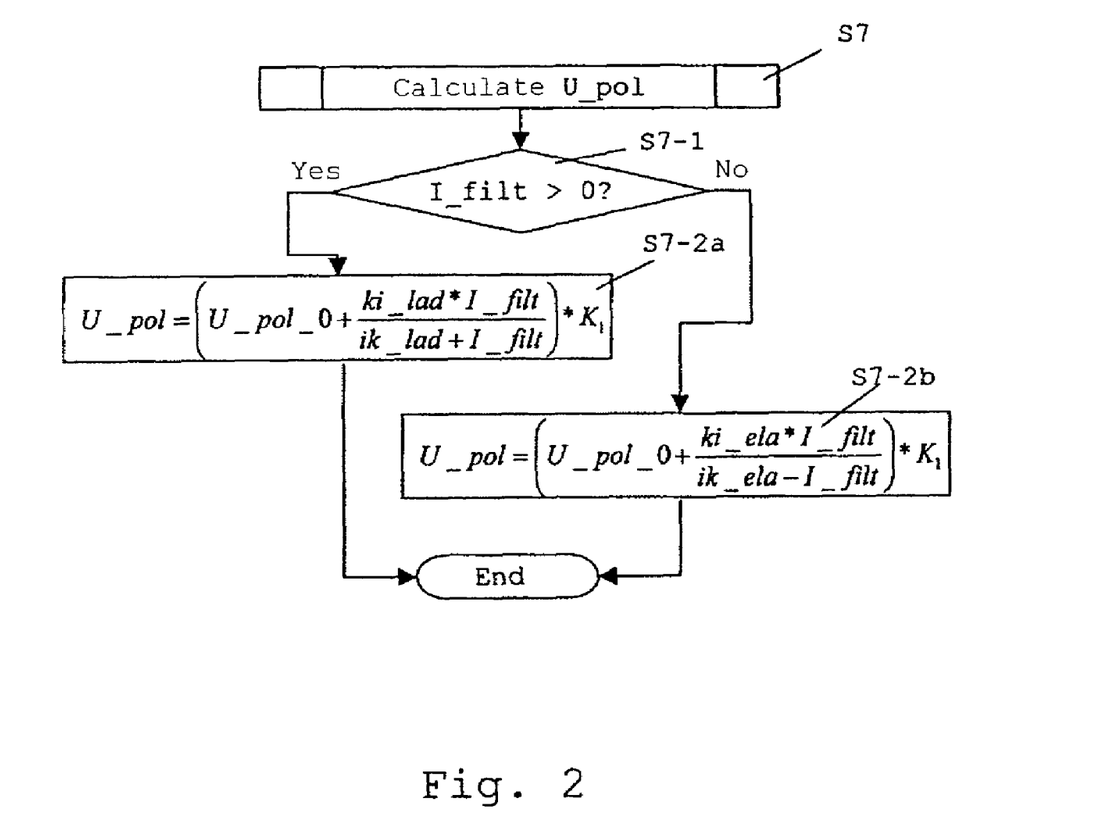
FIG. 2 shows a flowchart of a subroutine "calculation of the polarization voltage U_pol" from FIG. 1.

The method according to the invention for predicting the voltage of a battery, in particular of a vehicle battery, will be described in more detail in the following text with reference to the flowcharts shown in FIGS. 1 to 3.

In order to ensure that specific, safety-critical loads, such as the Sensotronic Brake Control or SBC (electrohydraulic brakes) remain fully operational, the vehicle battery voltage must not fall below a specific minimum voltage, since this results in a voltage drop when a load is applied. The method according to the invention can now be used to predict what battery voltage U_pred will occur when it is discharged with a predetermined current I_pred, that is to say when a defined load is to be expected.

In a first step S1, actual battery data, such as the battery voltage U_batt, the battery current I_batt, the battery temperature T_batt and the dynamic internal resistance Rdi of the battery, is detected and is checked by external detection and calculation devices. In this case, the battery voltage U_batt, the battery current I_batt, and the battery temperature T_batt are detected by means of sensors, are transmitted to a control device and are checked by the control device, which carries out the method according to the invention for predicting the voltage of a battery. The dynamic internal resistance Rdi is calculated by means of a known routine, and the calculation result is likewise transmitted to the control device and is checked by the control device. A method such as this for calculation of the dynamic internal resistance Rdi is known, for example, from DE 102 08 020 A1, in which the value that is obtained for the dynamic internal resistance has already been filtered. The values for the battery voltage U_batt, the battery current I_batt, the battery temperature T_batt and the dynamic internal resistance Rdi are transmitted to the control device, and are checked by the control device, at predetermined internals t, for example every 50 ms. Negative values of the detected values of the battery current I_batt indicate discharging, and positive values indicate charging of the battery.

A check is then carried out in a step S2 to determine whether this functional procedure is a first procedure. This is done by checking the state of a bit which is set during a first functional procedure and is reset again on each new start. When the bit is set, that is to say a functional procedure (step S1 to S12) has already been carried out, the procedure moves on to step S3. Otherwise, the procedure moves on directly to step S5, in order to allow a quick prediction of the battery voltage directly after the new start.

A step S3 is used to determine whether a time Tx, in this case 500 ms, has already elapsed, that is to say the procedure moves on to step S4 after 500 ms, otherwise the procedure returns to step S1.

If it is found in step S3 that the conditions are satisfied, the battery voltage U_batt and the battery current I_batt are filtered by means of a low-pass filter in a step S4. The filtering process results in a filtered battery voltage value U_filt and a filtered battery current value I_filt being determined from the battery voltage U_batt and the battery current I_batt, with the ripple having been filtered out of each of them. The filtered battery voltage value U_filt and the filtered battery current value I_filt after low-pass filtering are obtained from the following equations:

$$U\_filt(t_n)=(U\_batt-U\_filt(t_{n-1}))*(1-\exp(-t/T))++U\_filt(t_{n-1})$$

$$I\_filt(t_n)=(I\_batt-I\_filt(t_{n-1}))*(1-\exp(\_t/T))++I\_filt(t_{n-1})$$

In this case, T is a filter constant which, for example, is chosen to be 500 ms, while t is an interval in which a value record is in each case read and which is, for example 50 ms. $t_n$ is the actual time, while $t_{n-1}$ is the time of the last calculation. If no previous calculation has yet taken place, predetermined initialization values are used.

By way of example, values are defined as follows for initialization purposes, on the basis of the settling times of the low-pass filter that is used: U_filt=11.8, I_filt=0.0 and Rdi=5.0.

The input variables are read into the low-pass filter as quickly as possible, provided that the values are valid, that is to say the hardware for detection of the battery voltage U_batt and of the battery current I_batt must produce valid values. A quick prediction is produced on the first function call of the method for predicting the voltage of a battery, for example after a time period Tx, that is to say 500 ms in the example. The filtering through the low-pass filter is not also included in this, that is to say the steps S3 and S4 are jumped over in the first function call. In the first 5 seconds, for example, after this function call, all of the time constants are set to 1 second since this allows the method to stabilize quickly.

The predicted battery voltage U_pred is calculated, that is to say the functional procedure is carried out, after a time period T, that is to say after 500 ms in the example.

The predicted battery voltage U_pred is calculated only when the battery current I_batt is greater than the predetermined load current I_pred on which the prediction is based. A predetermined tolerance Tol is permitted in this case, for example of 5 A. There is no need to carry out a calculation process for a battery current I_batt that is less than I_pred, since the drop in voltage at that time would be greater than a voltage drop to be predicted. The procedure then returns to step S1.

A check is thus carried out in step S5 to determine whether the following conditions which are necessary to carry out the calculation of the predicted battery voltage U_pred are satisfied:

$$I\_filt>(I\_pred-Tol)$$

and $$I\_batt>I\_pred-Tol$$

This second-mentioned condition is in this case additionally checked, since greater currents are reached during a starting process but a calculation would otherwise be allowed on the basis of the filter. Such errors should, however, be precluded.

If it is found in step S5 that the conditions stated above are not satisfied, the predicted battery voltage U_pred is not calculated and the procedure returns to step S1.

If it is found in step S5 that the above conditions are satisfied, then a resistive voltage drop across the dynamic internal resistance Rdi is then calculated in a step S6. For this purpose, the filtered battery current and internal resistance values (I_filt and Rdi) are used to calculate the voltage drop U_ri that is produced by the predetermined load current I_pred through the dynamic internal resistance Rdi, using the following formula:

$$U\_ri=(I\_filt-I\_pred)*Rdi$$

Since the predetermined load current I_pred is always a discharge current, it must also be used in a negative form. The value range for the predetermined load current I_pred is, for example, between −80 A and −150 A.

A polarization voltage U_pol is then calculated in a step S7. The subroutine for calculation of the polarization voltage in step S7 is illustrated in more detail in FIG. 2. The polarization voltage U_pol has a number of chemical causes, that is to say it is composed of a number of voltage elements. These voltage elements are, among others, the crossover voltage or activation voltage, the crystallization voltage and the diffusion voltage. The crossover voltage results from the local distribution of the ions first of all having to be built up when a current change occurs, and this does not take place as quickly as the current builds up, with the distribution of the charged particles on the surface being comparable with a capacitor. The crystallization voltage is the voltage required to release molecules on the surface of the electrode from their compound form and to make them accessible for a reaction. Finally, the diffusion voltage is the voltage which is required in order to remove the reaction products from the electrode surface. These voltage elements are each exponentially dependent on the battery current, specifically the current magnitude and the current direction, as well as the temperature.

The entirety of the polarization voltage U_pol can be described sufficiently accurately by two simple reciprocal functions. The polarization voltage U_pol can be determined as follows, although it is in each case necessary to decide whether the battery is being charged, that is to say I_filt>0, or whether the battery is being discharged, that is to say I_filt ? 0.

A decision is therefore first of all made in a step S7-1 as to whether the filtered battery current I_filt is greater than zero. Depending on the decision results, the polarization voltage U_pol is calculated in a step S7-2a or S7-2b using the following formula:

If I_filt>0:

$$U\_pol=(U\_pol\_0+(ki\_lad+I\_filt/(ik\_lad+I\_filt)))*K_1.$$

If $I\_filt \neq 0$:

$$U\_pol=(U\_pol\_0+(ki\_ela-I\_filt/(ik\_ela-I\_filt)))*K_1$$

$K_1$ in the above equations is a correction factor which is unity when the predetermined load current I_pred is −100 A, while it is in the range between −80 A and −150 A, from (1−(I_pred+100)/100*0.2) for a predetermined load current I_pred. It is obvious in this case to those skilled in the art that an appropriate, adapted correction value can be determined when a load current range other than this load current range is desired.

Figure 4:
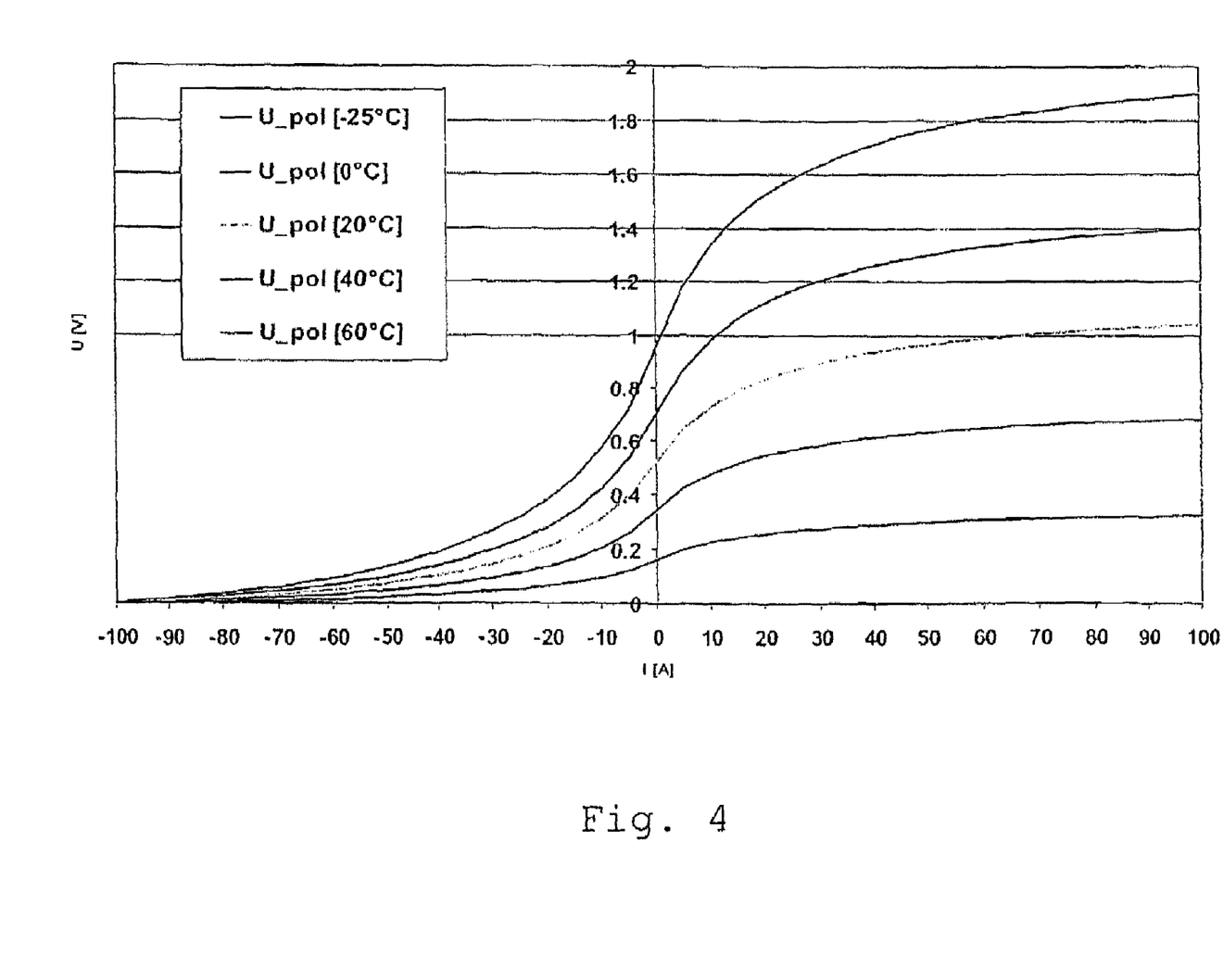
FIG. 4 shows an illustration of examples of current-dependent profiles of the polarization voltage.

In this case, the parameters U_pol_0, ki_lad, ik_lad, ki_ela and ik_ela are predetermined parameters. By way of example, U_pol_0 may be 0.7 V at 0° C. The temperature dependency is −9 mV/° C. This means that:

$$U\_pol\_0=0.7V-0.009V/° C.*T\_batt \ [T\_batt \ in \ °C.]$$

ik_lad and ik_ela are empirical parameters which describe the curvature of the curve of the polarization voltage U_pol as a function of the filtered battery current I_filt. FIG. 4 shows one such curved profile for various battery temperatures T_batt. By way of example, the value of ik_lad may be 80 A, and the value of ik_ela may be 20 A. ki_ela is non-dimensional and can be defined such that the value for U_pol is 0 V when I_filt=I_pred.

Thus:

$$ki\_ela=U\_pol\_0*(ik\_ela-I\_pred)/(-I\_pred*[VA]) \ \text{and}$$

$$ki\_lad=U\_pol\_0*(ik\_lad-I\_pred)/(-I\_pred*[VA])*K_2.$$

A correction factor $K_2$ must be taken into account during charging, since very high overvoltages can occur during charging, which would be too great for calculation. This correction or compensation factor $K_2$ also allows these voltages to be calculated.

This description of the polarization voltage U_pol is valid when the battery is in a quasi-steady state, that is say when it is stabilized, that is to say when the battery current I_batt is constant.

The polarization voltage U_pol varies only slowly as a result of the chemical reactions which are concealed behind this phenomenon. The change follows two superimposed time constants. The parameter U_pol determined as described above thus comprises a fast and a slowly settling part U_pol_fast_raw and U_pol_slow_raw.

$$U\_pol\_fast\_raw=0.6*U\_pol \ \text{and}$$

$$U\_pol\_slow\_raw=0.4*U\_pol,$$

that is to say 60% of U_pol settles quickly, and 40% settles slowly.

Figure 3:
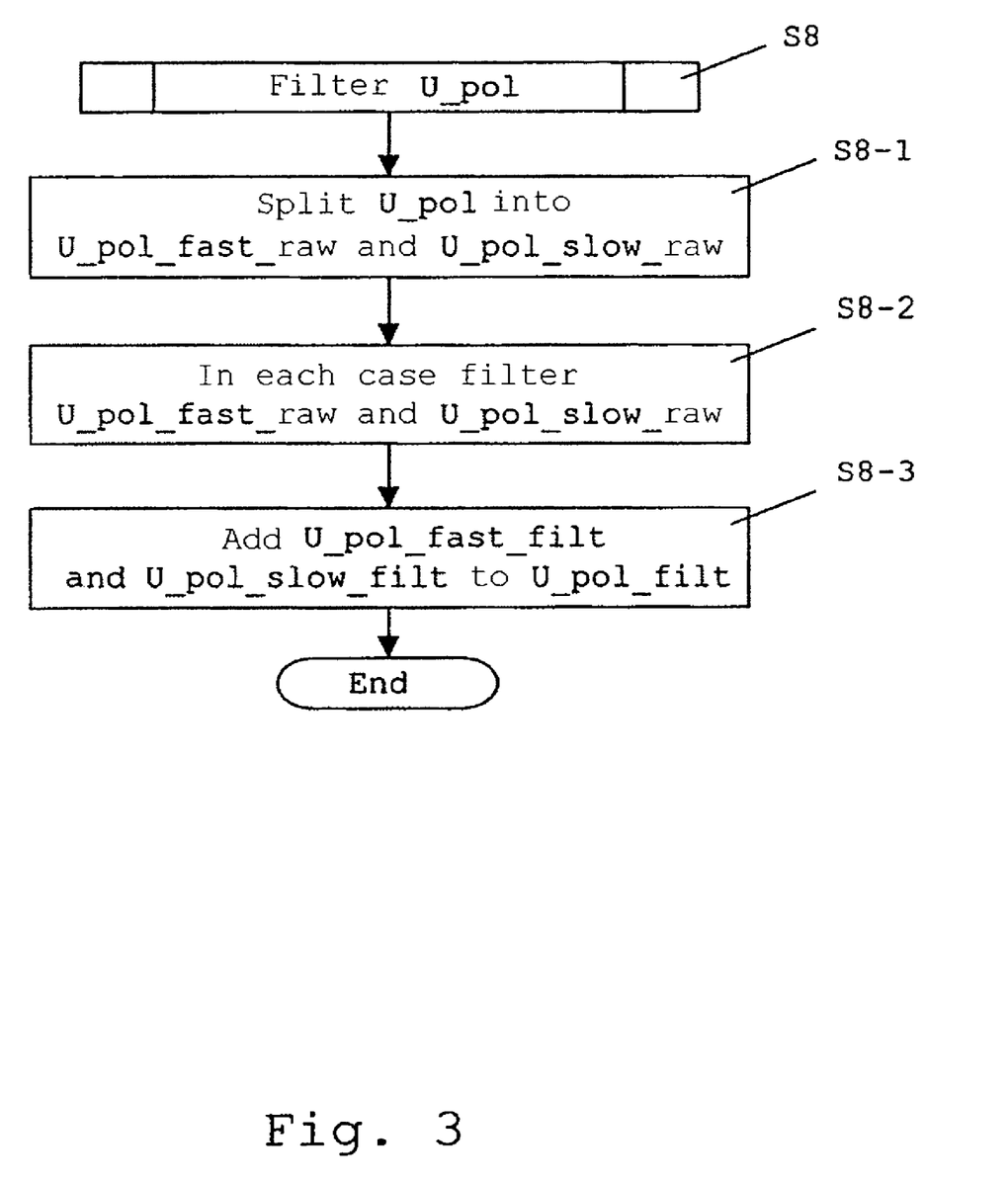
FIG. 3 shows a flowchart of the subroutine "filtering of the polarization voltage U_pol" from FIG. 1.

The polarization voltage U_pol is thus filtered in a further step S8, whose detailed procedure is illustrated in more detail in FIG. 3, with this filtering preferably being carried out by two low-pass filters, in each case one for a faster settling component U_pol_fast_raw of U_pol and one for a slowly settling component U_pol_slow_raw of U_pol.

First of all, in a step S8-1, the polarization voltage U_pol is subdivided into the still unfiltered raw values of the polarization voltage U_pol_fast_raw and U_pol_slow_raw. These two polarization voltage components U_pol_fast_raw and U_pol_slow_raw are then filtered by means of two low-pass filters in a step S8-2.

This results in:

| $U\_pol\_fast\_filt(t_n) =$ | $(U\_pol\_fast\_raw$ $-Upol\_fast\_filt(t_{n-1}))*$ $*T + U\_pol\_fast\_filt(t_{n-1})$ |
|---|---|

| $U\_pol\_slow\_filt(t_n) =$ | $(U\_pol\_slow\_raw$ $-Upol\_slow\_filt(t_{n-1}))*$ $*T + U\_pol\_slow\_filt(t_{n-1})$ |
|---|---|

The time constants of the low-pass filters for U_pol_fast_raw and U_pol_slow_raw are in this case different depending on whether charging is taking place, that is to say I_filt>0, or discharging is taking place, that is to say I_filt ≠ 0. By way of example, the time constants are:

If I_filt>0:

T for U_pol_fast_filt=1 second

T for U_pol_slow_filt=1 minute

If I_mean ≠ 0:

T for U_pol_fast_filt=1 second

T for U_pol_slow_filt=30 seconds

The filtered values of the two polarization voltage components U_pol_fast_filt and U_pol_slow_filt are then added in a further step S8-3 in order to obtain a filtered polarization voltage U_pol_filt.

These values for parameters for determination of the polarization voltage are likewise only examples, and do not represent any restriction.

The predicted battery voltage U pred is then calculated in a step S9, which is carried out after this, from the voltage values as determined in the steps S4, S6 and S7 and S8 for the filtered battery voltage U_filt, the resistive voltage drop U_ri and the filtered polarization voltage U_pol_filt, using the following formula:

$$U\_pred=U\_filt-U\_ri-U\_pol\_filt$$

The predicted battery voltage U_pred determined in this way in step S9 is also limited upwards and downwards in step S10 by, by way of example, defining 12.5 V as the maximum value U_pred_max and 10 V as the minimum value U_pred_min. In this case, it is not absolutely essential to limit upwards, since the battery charge is in any case sufficient there; nevertheless, in the preferred exemplary embodiment, the maximum value U_pred_max is fixed at a value close to a normal value of a fully charged battery in the rest state. Limiting downwards is, however, always necessary by means of a minimum value U_pred_min since, below this voltage level, the battery is aged or being discharged or the like such that it is no longer possible to reliably predict the battery voltage on the basis of an exponentially falling voltage below this threshold value. In the situation where the predicted battery voltage U_pred is between the limit values U_pred_min and U_pred_max, the predicted battery voltage is then filtered in a further step S11, in which case the time constant T of this filter may be 3 minutes both for negative and for positive current levels. This further filtering in step S11 filters out sudden changes which occur as a result of switching from charging to discharging.

Thus:

$$U\_pred\_filt(t_n)=(U\_pred\_raw-U\_pred\_filt(t_{n-1}))*T++U\_pred\_filt(t_{n-1})$$

where, for example, T is chosen to be 3 minutes.

Finally, a check is carried out in step S12 to determine whether the bit which indicates whether a first function call has already been made is set. If the bit is not set, this bit is set, and the procedure then returns to step S1. Otherwise, the procedure returns directly to step S1.

This means that a battery voltage can be determined reliably, in particular of a vehicle battery when loaded with a load current, defined in advance, of I_pred. This prediction can be used for batteries of all types, in particular for vehicle batteries of any type, size and capacity.

In summary, the present invention discloses a method for predicting the voltage of a battery, in particular of a vehicle battery. The method according to the invention makes it possible to predict a voltage drop before it actually occurs as a result of a load. For this purpose, a filtered battery voltage and a filtered battery current are first of all determined from battery data, such as the battery voltage, the battery current, the battery temperature and the dynamic internal resistance. The resistive voltage drop across the dynamic internal resistance is determined from the difference current between the filtered battery current and the predetermined load current. Furthermore, a polarization voltage is calculated as a function of the filtered battery current, and is then filtered. A predicted battery voltage is calculated from the filtered battery voltage, minus the resistive voltage drop and the filtered polarization voltage. This predicted battery voltage can be used to decide on further measures.

The invention claimed is:

1. A method for predicting the voltage of a battery, having the following steps:
   (S1) determining and checking battery data, by detection and calculation devices, with the battery data comprising a battery voltage (U_batt), a battery current (I_batt), a battery temperature (T_batt) and a dynamic internal resistance (Rdi),
   (S2) checking whether present functional procedure is a first procedure,
   (S3) if the result in step S2 is that a functional procedure has already been carried out, checking whether a predetermined time (Tx) has elapsed, and, if the predetermined time has not yet elapsed, returning to step S1,
   (S4) if the predetermined time (Tx) has elapsed, filtering of the battery voltage (U_batt) and of the battery current (I_batt) using a low-pass filter, and emission of a filtered battery voltage (U_filt) and of a filtered battery current (I_filt),
   (S5) checking whether the filtered battery current (I_filt) is greater than a predetermined load (I_pred) minus a tolerance (Tol), and whether the battery current (I_batt) is greater than a predetermined load current (I_pred) minus the tolerance (Tol) and, if the conditions are not satisfied, returning to step S1,
   (S6) calculation of a resistive voltage drop (U_ri) across the dynamic internal resistance (Rdi),
   (S7) calculation of a polarization voltage (U_pol) as a function of the filtered battery current (I_batt_filt),
   (S8) filtering of the polarization voltage (U_pol), using two low-pass filters separately on the basis of a fast settling component (U_pol_fast_raw) and a slowly settling component (U_pol_slow_raw) and emission of a filtered polarization voltage (U_pol_filt),
   (S9) calculation of a predicted battery voltage by subtracting the resistive voltage drop (U_ri) and the filtered polarization voltage (U_pol_filt) from the filtered battery voltage (U_batt_filt),
   (S10) limiting of the predicted battery voltage (U_pred) determined in step S9 upwards and downwards,
   (S11) filtering of the predicted battery voltage (U_pred), and
   (S12) checking whether the a bit which indicates that a first function call has been carried out is set and, if not, setting the bit and returning to step S1, or, if yes, returning to step S1.

2. The method for predicting the voltage of a battery as claimed in claim 1, wherein the dynamic internal resistance (Rdi) is determined by means of an algorithm.

3. The method for predicting the voltage of a battery as claimed in claim 1, wherein the predetermined time (Tx) in step S3 is 500 ms.

4. The method for predicting the voltage of a battery as claimed in claim 1, wherein the filtered battery voltage (U_filt) and the filtered battery current (I_filt) are obtained from the following equations:

$$U\_filt(t_n)=(U\_batt-U\_filt(_{m-1}))*(1\ exp(-t/T))++U\_filt(t_1)$$

$$I\_filt(t_n)=(I\_batt-I\_filt(t_{n-1}))*(1\ exp(-t/T))++I\_filt(t_{n-1})$$

where T is a filter constant for the low pass filter utilized, t is an interval in which a value record is in each case read and $t_n$ is the actual time, while $t_{n-1}$ is the time of the last calculation.

5. The method for predicting the voltage of a battery as claimed in claim 1, wherein steps S3 and S4 are jumped over and the method proceeds directly to step S5 if a first functional procedure directly after a start of the method is detected in step S2.

6. The method for predicting the voltage of a battery as claimed in claim 1, wherein the tolerance (Tol) is chosen to be 5A.

7. The method for predicting the voltage of a battery as claimed in claim 1, wherein the resistive voltage drop is calculated using the following equation:

$$U\_ri=(I\_filt-I\_pred)*Rdi.$$

8. The method for predicting the voltage of a battery as claimed in claim 1, wherein the polarization voltage (U_pol) is calculated taking into account the stated conditions using the following equations:

If I_filt>0:

$$U\_pol=(U\_pol0+(ki\_lad*I\_filt/(ik\_lad+I\_filt)))**K_1.$$

If I_fil≤0:

$$U\_pol=(U\_pol\_0+(ki\_ela*I\_filt/(ik\_ela-I\_filt)))**K_1,$$

where K is a correction factor which is dependent on the predetermined load (I_pred), and parameters U_pol_0, ki_lad, ik_lad ki_ela and ik_ela are predetermined parameters which have been determined empirically, and ki_ela can be defined such that the value of the polarization voltage (U_pol) is 0 V if the filtered battery current (I_filt) is equal to the predetermined load current (I_pred).

9. The method for predicting the voltage of a battery as claimed in claim 1, wherein the polarization voltage (U_pol) has a fast settling component (U_pol_fast_raw) and a slowly settling component (U_pol_slow_raw), with the fast settling component (U_pol_fast_raw) making up 60% of the polarization voltage (U_pol) and the slowly settling component (U_pol_slow_raw) making up 40% of the polarization voltage (U_pol), and each of these two components being filtered by a low-pass filter in step S8, thus resulting in the following equations:

$$U\_pol\_fast\_filt(t_n) = (U\_pol\_fast\_raw - U pol\_fast\_filt(t_{n-1})) * T + U\_pol\_fast\_filt(t_{n-1})$$

$$U\_pol\_slow\_filt(t_n) = (U\_pol\_slow\_raw - U pol\_slow\_filt(t_{n-1})) * T + U\_pol\_slow\_filt(t_{n-1})$$

and the overall filtered polarization voltage (U_pol_filt) is obtained by addition of the two filtered components of the polarization voltage (U_pol_fast_filt, U_pol_slow_filt).

10. The method for predicting the voltage of the battery as claimed in claim 8, wherein the correction factor $K_1$ is unity when the predetermined load current (I_pred) is −100 A, while it is obtained from (1−(I_pred+100)/100*0.2) for a predetermined load current (I_pred) between −80 A and −150 A.

* * * * *